(12) United States Patent
Lemberg et al.

(10) Patent No.: US 11,342,888 B2
(45) Date of Patent: May 24, 2022

(54) TRI-PHASING MODULATION FOR EFFICIENT AND WIDEBAND RADIO TRANSMITTER

(71) Applicant: NOKIA SOLUTIONS AND NETWORKS OY, Espoo (FI)

(72) Inventors: Jerry Lemberg, Helsinki (FI); Mikko Martelius, Espoo (FI); Marko Kosunen, Helsinki (FI); Enrico Roverato, Helsinki (FI); Kari Stadius, Sundsberg (FI); Jussi Ryynänen, Vantaa (FI)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 187 days.

(21) Appl. No.: 16/644,320

(22) PCT Filed: Sep. 7, 2017

(86) PCT No.: PCT/EP2017/072486
§ 371 (c)(1),
(2) Date: Mar. 4, 2020

(87) PCT Pub. No.: WO2019/048045
PCT Pub. Date: Mar. 14, 2019

(65) Prior Publication Data
US 2020/0212848 A1 Jul. 2, 2020

(51) Int. Cl.
*H03F 1/07* (2006.01)
*H03F 1/02* (2006.01)
(Continued)

(52) U.S. Cl.
CPC ........ *H03F 1/0294* (2013.01); *H03F 3/195* (2013.01); *H03F 3/245* (2013.01); *H04B 1/0483* (2013.01);
(Continued)

(58) Field of Classification Search
CPC .................................... H03F 1/07; H03F 1/02
(Continued)

(56) References Cited

U.S. PATENT DOCUMENTS 6,998,914 B2* 2/2006 Robinson ................. H03C 5/00
330/10
2008/0290939 A1* 11/2008 Grundlingh ........... H03F 1/3229
330/149
(Continued)

OTHER PUBLICATIONS

International Search Report and Written Opinion dated Apr. 25, 2018 corresponding to International Patent Application No. PCT/EP2017/072486.
(Continued)

*Primary Examiner* — Henry Choe
(74) *Attorney, Agent, or Firm* — Squire Patton Boggs (US) LLP

(57) ABSTRACT

According to an aspect, there is provided a method for power-amplification of a transmission signal, comprising: obtaining the transmission signal with phase and amplitude modulation; generating a power-amplified polar signal for approximating a power-amplified transmission signal by power-amplifying a first constant-envelope signal with one of two or more first amplification factors based on the transmission signal; generating an outphasing pair of a first power-amplified outphasing signal and a second power-amplified outphasing signal based on the transmission signal; and combining the power-amplified polar signal, the first power-amplified outphasing signal and the second power-amplified outphasing signal to provide the power-amplified transmission signal.

21 Claims, 10 Drawing Sheets

(51) Int. Cl.
    *H03F 3/195* (2006.01)
    *H03F 3/24* (2006.01)
    *H04B 1/04* (2006.01)

(52) U.S. Cl.
    CPC .. *H03F 2200/336* (2013.01); *H03F 2200/451* (2013.01); *H04B 2001/0491* (2013.01)

(58) Field of Classification Search
    USPC .............................................. 330/124 R, 295
    See application file for complete search history.

(56) References Cited

U.S. PATENT DOCUMENTS

| | | |
|---|---|---|
| 2011/0254636 A1 | 10/2011 | Chen et al. |
| 2012/0062318 A1 | 3/2012 | Xu et al. |
| 2014/0120854 A1 | 5/2014 | Briffa et al. |

OTHER PUBLICATIONS

Communication pursuant to Article 94(3) EPC dated Jan. 18, 2021 corresponding to European Patent Application No. 17762131.5.
Communication pursuant to Article 94(3) EPC dated Nov. 4, 2021 corresponding to European Patent Application No. 17762131.5.

\* cited by examiner

TRI-PHASING MODULATION FOR EFFICIENT AND WIDEBAND RADIO TRANSMITTER

FIELD

The invention relates generally to radio transmitters and particularly to radio transmitters utilizing switched-mode power amplifiers.

BACKGROUND

In radio transmitters, a transmission signal, i.e., the signal being transmitted, is amplified in a radio frequency power amplifier (PA) which amplifies the transmission signal to a level suitable for transmission over an air interface to a radio receiver. While conventional linear power amplifiers have previously provided efficient operation in most systems, emerging 5G systems employing wider modulation bandwidths, more complex modulation schemes and waveforms and large-scale antenna systems often require the use of transmission signals with high peak-to-average power ratios (PAPR) which leads to low power efficiency with conventional linear power amplifiers (PA). The transmitter chain efficiency may be improved by utilizing highly efficient but non-linear switched mode power amplifiers (SM-PA).

Efficient polar and outphasing transmitters inherently utilize constant-envelope phase-modulated signals and thus are capable of employing SM-PAs. Polar transmitters can achieve very high efficiency by modulating the supply voltage of SM-PAs to generate amplitude modulation. However, due to limited bandwidth of supply modulators, achieved signal bandwidths are limited. On the other hand, outphasing transmitters generate amplitude modulation by utilizing a phase offset between two constant-envelope signals. Therefore, outphasing moves the bandwidth requirements to the phase modulators, potentially enabling wider signal bandwidth. However, the efficiency of a wideband outphasing transmitter utilizing switching or class-D SM-PAs degrades quickly in power back-off, thus resulting in poor efficiency with high PAPR signals. Multilevel outphasing has been proposed as a solution to improve the efficiency of outphasing transmitters in power back-off, though the multilevel outphasing operation has been shown to lead to additional distortion.

In summary, there is a demand for a SM-PA-based power-amplification scheme and transmitter architecture which would provide high efficiency and enable wide bandwidth operation without significantly distorting or degrading the transmission signal having a high PAPR.

BRIEF DESCRIPTION OF THE INVENTION

An object of the invention is to provide an improved solution for power-amplifying a transmission signal having a high peak-to-average power ratio.

According to an aspect of the invention, there is provided a method as described in claim 1.

According to another aspect of the invention, there is provided an apparatus as specified in claim 16.

According to another aspect of the invention, there is provided an apparatus as specified in claim 19.

According to another aspect of the invention, there is provided a computer program product as specified in claim 20.

According to another aspect of the invention, there is provided an apparatus as specified in claim 21.

According to another aspect of the invention, there is provided an apparatus as specified in claim 22.

Preferred embodiments of the invention are defined in dependent claims.

LIST OF DRAWINGS

In the following, the invention will be described in greater detail with reference to the embodiments and the accompanying drawings, in which FIG. 1 illustrates a block diagram of an outphasing transmitter FIG. 2 illustrates a block diagram of a multi-level outphasing transmitter FIG. 3 illustrates the principle of tri-phasing according to an embodiment of the invention;

DESCRIPTION OF EMBODIMENTS

Figure 1:
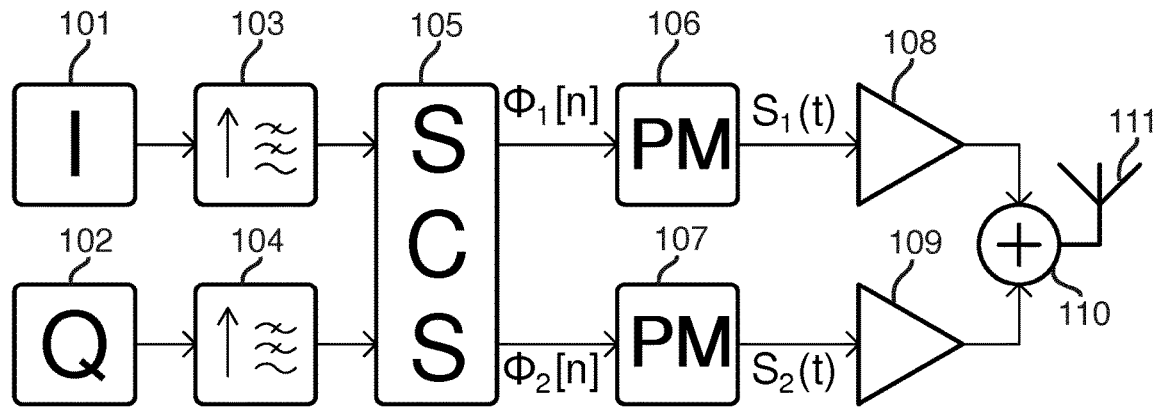

To provide background to the embodiments of the invention, FIG. 1 illustrates an outphasing transmitter according to the prior art. The illustrated outphasing transmitter 100 comprises in-phase and quadrature signal sources 101, 102, two upsampling and low-pass filtering units 103, 104 connected to said signal sources 101, 102, a signal component separator unit 105, two phase modulators 106, 107, two power amplifiers 108, 109, a combiner 110 and an antenna 111.

The modulation sources 101, 102 provide in-phase (I) and quadrature (Q) components of a transmission signal comprising information symbols to be transmitted from the radio transmitter to a radio receiver. The transmission signal may be in a digital form and may be both amplitude- and phase-modulated. The transmission signal may also have relatively high peak-to-average power ratio, necessitating the use of switched mode power amplifiers for high efficiency. The I and Q components of the transmission signal are then fed to the upsampling and low-pass filtering units 103, 104 and from the upsampling and low-pass filtering units 103, 104 to the signal component separator unit 105. The signal component separator unit 105 generates a polar angle (a polar phase component) and an outphasing angle based on the I and Q components of the transmission signal. The phase modulators 106, 107 generate two constant-envelope signals and modulate the phase of one of said constant envelope signals with a polar angle and a positive outphasing angle and the phase of the other constant-envelope signal with the polar angle and a negative outphasing angle with equal absolute value to the positive outphasing angle. The value of the polar angle and the outphasing angle may be determined and provided to the phase modulators 106, 107 by the signal component separator 105 based on the transmission signal. The two phase-modulated signals are amplified by power amplifiers 108, 109, preferably switched-mode power amplifiers, having substantially equal gain. Finally, the two power-amplified phase-modulated outphasing signals are combined by the combiner 110 to provide a transmission signal for the antenna 111.

Figure 2:
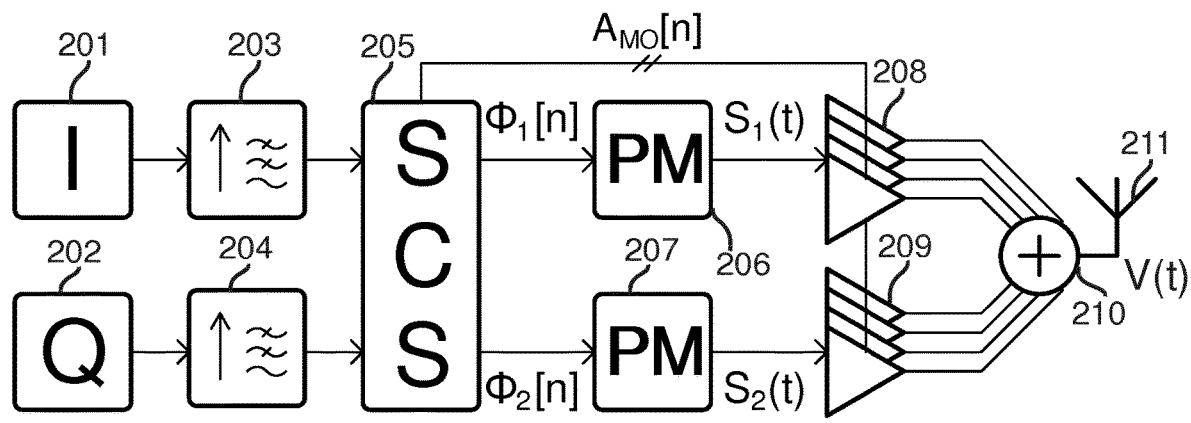

The transmitters according to prior art illustrated in FIG. 1 and FIG. 2 as well as the transmitters according embodiments of the invention are all configured to primarily utilize switched-mode power amplifiers. Unlike conventional linear power amplifiers, switched-mode power amplifiers are non-linear devices which continually switch between fully conductive and nonconductive states spending very little time in the high dissipation transitions. As a consequence, switched-mode power amplifiers are considerably more efficient than conventional linear power amplifiers where a considerable part of the input power is unavoidably lost. However, due to the non-linear nature of switched-mode power amplifiers, they may only be used with constant-envelope signals without causing signal distortion. Therefore, many conventional transmitter architectures are not able to support switched-mode power amplifiers and special transmitter architectures are needed to best make use of the high efficiency (ideally 100%) provided by the switched-mode power amplifiers. The switched-mode power amplifiers here and in the following may be of class D, class E, class F or inverse class F (class $F^{-1}$).

The transmitter of FIG. 1 may provide wide bandwidth operation with high efficiency with switched-mode power amplifiers due to the transmitter taking advantage of the concept of outphasing. As this concept plays a part in part also in the embodiments of the present invention, the concept will be described here in detail. The normalized amplitude- and phase-modulated signal V(t) (as illustrated also in FIG. 1) may be written in polar form as $$V(t)=r(t)\cos(\omega_c t+\phi(t)), r(t)\in[0,1],$$

where $\omega_c$ is the angular carrier frequency and r(t) and $\phi(t)$ correspond to the normalized envelope and phase of the complex baseband data signal, respectively. In outphasing, V(t) is divided into two constant-envelope outphasing signals $S_1(t)$ and $S_2(t)$ as $$V(t)=(S_1(t)+S_2(t))/2,$$

$$S_1(t)=\cos(\omega_c t+\phi(t)+\theta(t)),$$

$$S_2(t)=\cos(\omega_c t+\phi(t)-\theta(t)),$$

where the phases of outphasing signals $S_1(t)$ and $S_2(t)$ are modulated by the polar angle $\phi(t)$ and the positive/negative outphasing angle $\theta(t)$. The combined signal V(t) may be rewritten using well-known trigonometric identities as $$V(t)=(S_1(t)+S_2(t))/2=\cos(\theta(t))\cos(\omega_c t+\phi(t)).$$

This equation reveals the fundamental property of outphasing, namely that the amplitude of the combined outphasing signals is modulated by the outphasing angle. In other words, amplitude of the original signal may be modulated by modulating the phase (specifically, the outphasing angle) of the two outphasing signals. As may be observed from the previous equation, the maximum envelope amplitude for V(t) is obtained when the outphasing signals are in-phase, while the minimum envelope amplitude for V(t) is obtained when the outphasing signals are antiphase.

Referring to FIG. 1, $S_1(t)$ is provided by the first phase modulator 106 and $S_2(t)$ is provided by the second phase modulator 107 while the combiner 110 sums the two outphasing signals together to provide amplitude- and phase-modulated signal V(t) for the antenna 111. Obviously, in the transmitter of FIG. 1 the outphasing signals may have any (envelope) amplitude, that is, they may not be normalized, and they may be power-amplified by the power amplifiers 108, 109 before the combiner 110, but as long as the two outphasing signals have substantially equal envelope amplitudes and the gains of the two power amplifiers are substantially equal, the basic outphasing principle as described in the previous paragraph applies. The resulting amplitude- and phase-modulated signal may be written in this case as $$V(t)=A_V(S_1(t)+S_2(t))/2,$$

where $A_V$ is the amplication factor (gain) of the power amplifiers 108, 109.

As in the outphasing transmitter the bandwidth requirements are mostly dependent on the phase modulators, wider bandwidths may be achieved with the outphasing transmitter than with highly efficient polar transmitters in which amplitude is modulated directly and the bandwidth is limited by the bandwidths of the supply modulators. However, the efficiency of wideband outphasing transmitters utilizing class-D SM-PAs have been shown to degrade quickly in power back-off, resulting in poor efficiency with high PAPR signals. To overcome this problem, multilevel outphasing transmitter as illustrated in FIG. 2 has been proposed.

Referring to FIG. 2, the operation of elements 201, 202, 203, 204 may be similar to the operation of elements 101, 102, 103, 104 in the outphasing transmitter of FIG. 1. However, the signal component separator 205, in addition to providing a constant-envelope signal, a polar angle and an outphasing angle for phase modulators 206, 207, provides a discrete amplitude level selected from two or more predefined discrete amplitude levels to two or more power amplifiers 208, 209. Each of the two or more discrete amplitude levels may correspond to one or more power amplifiers of the two or more power amplifiers 208, 209 being active. The two or more power amplifiers 208, 209 may have equal or different gains. By selecting different discrete amplitude levels, different power amplifiers 208, 209 (also different number of power amplifiers 208, 209) may be selected for power-amplifying the output signals of the phase modulators 206, 207 and leading to different power-amplified transmission signal amplitude level. In some cases, the two or more power amplifiers 208, 209 may all have equal gain so that only the number of power amplifiers 208, 209 that are active determines the discrete amplitude level. Alternatively or additionally, gain of the two or more power amplifiers 208, 209 may be altered by changing supply voltage of the two or more power amplifiers 208, 209. In some cases, a single tunable power amplifier or several tunable power amplifiers may be used instead of the power amplifiers 208, 209. The amplitude of the power-amplified transmission signal may be further tuned by tuning the outphasing angle which affects the amplitude of the power-amplified transmission signal according to the outphasing principle as described in the previous paragraph.

Multilevel outphasing may be described by the following equations $$V(t) = \frac{A_{MO}(t)}{2A_{max}}(S_1(t) + S_2(t)), A_{MO}(t) \in \{1, 2, 3, \ldots A_{max}\},$$

where $A_{MO}(t)$ describes the pre-defined discrete amplitude levels. Assuming equally spaced amplitude levels up to integer level $A_{max}$, $A_{MO}(t)$ and the outphasing angle $\theta_{MO}(t)$ may be calculated, respectively, as $$A_{MO} = \text{ceiling}(r(t)A_{max}),$$

$$\theta_M(t) = \arccos\left(\frac{r(t)A_{max}}{A_{MO}(t)}\right),$$

where the ceiling function is used for defining the discrete amplitude level.

It should be appreciated that while in the above equations demonstrating the outphasing principle all the signals (namely $S_1(t)$, $S_2(t)$ and $V(t)$) were sinusoidal signals, the outphasing may be used also with some other signal types and specifically with square-wave signals though this may lead to potential problems not present with purely sinusoidal signals. This may be understood based on the fact any square wave may be decomposed to a summation of sinusoidal waves. Fourier series representations of square-wave outphasing signals may be written as:

$$S_{sq,1}(t) = \sum_n^\infty \frac{4}{n\pi} \sin(n(\omega_c t + \phi(t) + \theta(t)))), n \in \{1, 3, 5 \ldots\},$$

$$S_{sq,2}(t) = \sum_n^\infty \frac{4}{n\pi} \sin(n(\omega_c t + \phi(t) - \theta(t)))), n \in \{1, 3, 5 \ldots\}.$$

The resulting amplitude- and phase-modulated square-wave signal may be written in this case as $$V_{sq}(t) = (S_{sq,1}(t) + S_{sq,2}(t))/2.$$

Moreover, it may be shown that the amplitude of the nth harmonic of $V_{sq}(t)$ is proportional to $$A(t,n) \sim \cos(n\theta(t)).$$

In other words, the outphasing angle $\theta(t)$ may be used to modulate the amplitude of the transmission signal also in this case though different harmonics are affected differently leading to distortion of the signal.

Similar to the previous paragraph, it may also be shown that when using square waves in the case of multi-level outphasing, the amplitude of the nth harmonic may be expressed as $$A(n, r) = \frac{1}{A_{max}} \frac{4}{n\pi} A_{MO}(r) \cos(n\theta_{MO}(r)).$$

If an amplitude level transition occurs, for example, such that the discrete amplitude level $A_{MO}(r)$ changes from $A_0$ to $A_0+1$, this also causes a change in the outphasing angle, namely from 0 to $\theta_2(\neq 0)$. As the cosine term in the above equation is equal to one for all the harmonics of the square wave when $\theta_{MO}(r)=0$, but has different values for different harmonics when $\theta_{MO}(r)=\theta_2$, the square-wave time-domain waveform is changed due to the amplitude level transition. Due to the jump in the outphasing angle $\theta_{MO}(r)$, discontinuities in the harmonic waveforms may appear at point of the transition. As a consequence, the harmonics spread across the spectrum in frequency domain and set a limit on the adjacent channel leakage ratio (ACLR) of the transmitter.

In addition to the aforementioned problems, narrow pulses may appear in the outphasing signals $S_1(t)$ and $S_2(t)$, especially when square-wave signals are used, at the point of the transition as the outphasing angle changes abruptly within sampling period boundaries in a multilevel outphasing transmitter. As these pulses may not be reproducible by the power amplifiers, this may lead to pulse swallowing (PS). Said problem is prominent with sample-and-hold phase modulators (SH-PM) though it may be partly overcome by using digital interpolating phase modulators (DIPM). As the name implies, the DIPMs are phase modulators which in performing the phase modulation interpolate the phase of the input signal, for example, perform linear interpolation between two samples of the phase. In addition to eliminating narrow pulses, they have the added benefit that the sampling images of the phase signal are suppressed by sinc$^2$ response, instead of a sinc response as in SH-PMs, leading to improved ACLR.

While the changes in the outphasing angle do not lead to generation of narrow pulses in a multilevel outphasing transmitter with DIPMs, narrow pulses may still be generated when power amplifiers are switched on and off. Furthermore, the combination of phase interpolation in the DIPM and the amplitude level transitions in the multilevel outphasing may cause signal distortion up to one discrete amplitude level.

In order to overcome the signal degradation problems related to the multilevel outphasing, a new type of multilevel scheme and a new multilevel transmitter employing such a scheme are needed. A solution according to embodiment of the invention is the so-called tri-phasing approach. In the following, the principle of the tri-phasing and a method for implementing said principle for providing power-amplification without the signal degradation problems inherent in the previous solutions are described while a tri-phasing transmitter implementing said method is described thereafter.

Figure 3:
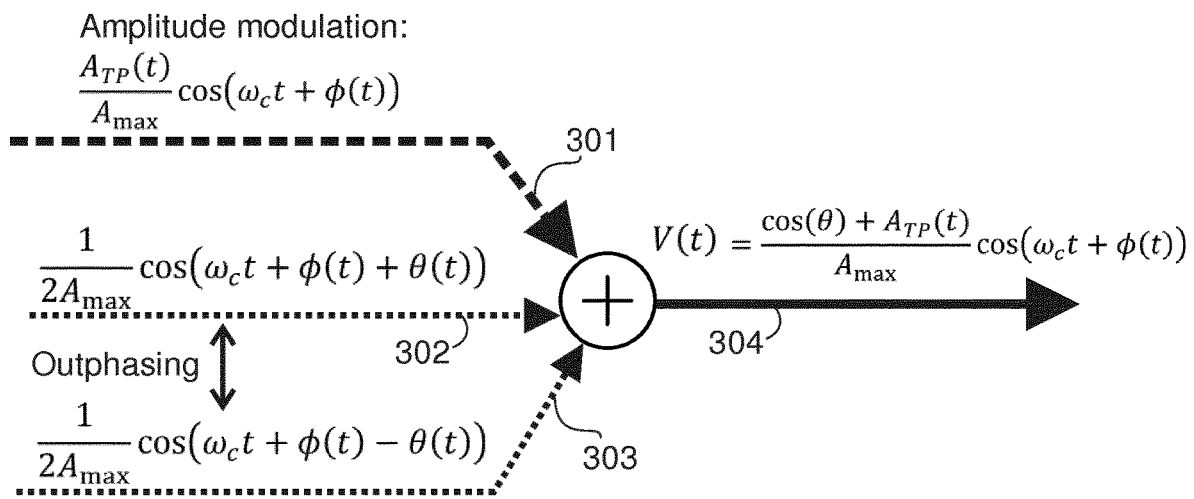

In tri-phasing approach according to an embodiment of the invention, instead of using two signal components as in outphasing or multi-level outphasing, three signal components are employed in order to enable continuous amplitude level transitions. This combination is illustrated in FIG. 3. The signal composition of the normalized phase- and magnitude-modulated transmission signal V(t) 304 in tri-phasing as also illustrated in FIG. 3 is defined as follows:

$$V(t) = \frac{1}{2A_{max}}(2 A_{TP}(t)S_0(t) + S_1(t) + S_2(t)),$$

$$S_0(t) = \cos(\omega_c t + \phi(t)),$$

$$S_1(t) = \cos(\omega_c t + \phi(t) + \theta(t)),$$

$$S_2(t) = \cos(\omega_c t + \phi(t) - \theta(t)),$$

where $S_0(t)$ is a polar modulator (or a polar signal), $S_1(t)$ and $S_2(t)$ are outphasing signals defined as in conventional outphasing and the discrete amplitude levels $A_{TP}(t)$ and the outphasing angle $\theta_{TP}(t)$ may be defined as $$A_{TP}(t) = A_{MO}(t) - 1,$$

$$\theta_{TP}(t) = \arccos(r(t)A_{max} - A_{TP}(t)),$$

where $A_{MO}(t)$ is defined similar to the multilevel outphasing, that is, such that $A_{TP}(t)$ describing the discrete amplitude levels of tri-phasing is defined as a non-negative integer having values ranging from zero to $A_{max}(t)-1$. The signals 301, 302, 303 correspond, respectively, to the polar modulator and the outphasing signals weighted according to the equation for V(t) shown above. As may be observed from the above signal composition and from FIG. 3, the tri-phasing approach takes elements from both basic outphasing (outphasing signals $S_1(t)$ and $S_2(t)$) and multi-level outphasing (multiple discrete power levels) approaches though it is not a simple combination of the two. In tri-phasing, the polar modulator $S_0(t)$ with discrete amplitude levels defined by $A_{TP}(t)$ is responsible for coarse amplitude resolution of the envelope r(t) while the outphasing modulators $S_1(t)$ and $S_2(t)$ enable fine amplitude resolution between the discrete amplitude levels. The discrete amplitude levels $A_{TP}(t)$ may be selected similar to the multi-level outphasing, namely by selecting one or more power amplifiers from a set of two or more power amplifiers for amplifying the polar signal. In some embodiments, selecting zero power amplifiers, that is, providing no power amplification may also be an option. Alternatively, gain of one or more power amplifiers may be altered by changing their supply voltage. While the individual outphasing signals are amplitude-modulated according to the discrete amplitude levels before they are combined in multilevel outphasing, in tri-phasing the outphasing and the amplitude modulation are parallel processes conducted for the same transmission signal. The resulting signals of these processes are combined to provide the tri-phasing signal (or a power-amplified transmission signal for a transmitter).

While an amplitude level transition in multilevel outphasing leads to discontinuities in the harmonics of a square wave as discussed earlier, amplitude level transitions in tri-phasing may be made continuous as the phase of the signal $S_0(t)$ is not affected by the amplitude level transitions. The amplitude level transitions only affect the outphasing modulator signals $S_1(t)$ and $S_2(t)$, which compensate for the change in the amplitude level $A_{TP}(t)$. Furthermore, in tri-phasing, the outphasing angle $\theta_{TP}(t)$ instantaneously shifts between 0 and $\pi/2$ at every amplitude level transition. As a consequence of these factors, the amplitude level transitions are invisible in the time-domain waveform.

The continuity in the harmonics of the square wave in tri-phasing may be easily understood by considering the amplitude the nth harmonic of a square wave in the output signal of the tri-phasing approach can be expressed as $$A(n, r) = \frac{1}{A_{max}} \frac{4}{n\pi}(A_{TP}(r) + \cos(n\theta_{TP}(r))), n \in \{1, 3, 5 \ldots\}.$$

Now, if the amplitude level $A_{TP}(r)$ is initially equal to $A_0$ with the outphasing angle being 0, the amplitude of the nth harmonic is equal to $$A(n, r) = \frac{1}{A_{max}} \frac{4}{n\pi}(A_0 + \cos(0)) = \frac{1}{A_{max}} \frac{4}{n\pi}(A_0 + 1).$$

If the amplitude level changes from $A_0$ to $A_0+1$, the outphasing angle changes from 0 to $\pi/2$ and the amplitude of nth harmonic is equal to $$A(n, r) = \frac{1}{A_{max}} \frac{4}{n\pi}\left(A_0 + 1 + \cos\left(\frac{n\pi}{2}\right)\right) = \frac{1}{A_{max}} \frac{4}{n\pi}(A_0 + 1).$$

In other words, amplitude of each harmonic of the square wave is equal at both the sides of the amplitude level transition, that is, the harmonics are continuous at the amplitude level transitions.

The other problems related multi-level outphasing described earlier, namely generation of narrow pulses and interpolation errors near amplitude level transitions with DIPMs may also be avoided by using the tri-phasing approach. Generation of narrow pulses during amplitude level transitions may be avoided by synchronizing the amplitude level transitions with the phase modulated signal, such that their transitions always occur with the same phase offset. In tri-phasing, the amplitude level transition does not affect the phase of the polar modulator signal $S_0(t)$. Thus, amplitude level transitions may be performed simultaneously when the polar modulator changes its polarity. The effect of this is that the polar modulator does not generate narrow pulses, as the average delay to the next transition is half of the carrier period. On the other hand, the incorrect interpolation with the DIPM during amplitude level transitions is intrinsically corrected in the tri-phasing approach as an instantaneous $\pi/2$ phase jump in the outphasing modulators $S_1(t)$ and $S_2(t)$ is always performed when an amplitude level transition occurs. With the DIPM, we have precise knowledge of the moment when the polar modulator has a zero crossing, which in turn defines the amplitude level transition and the phase shift in the outphasing modulators. A consequence of the instantaneous phase jump is that one of the outphasing modulators generates a pulse width proportional to approximately one fourth of the carrier period during amplitude level transitions. It should be appreciated that such pulses having a width of one fourth of carrier period are not considered narrow pulses and are, therefore, not swallowed by the power amplifiers.

Figure 4:
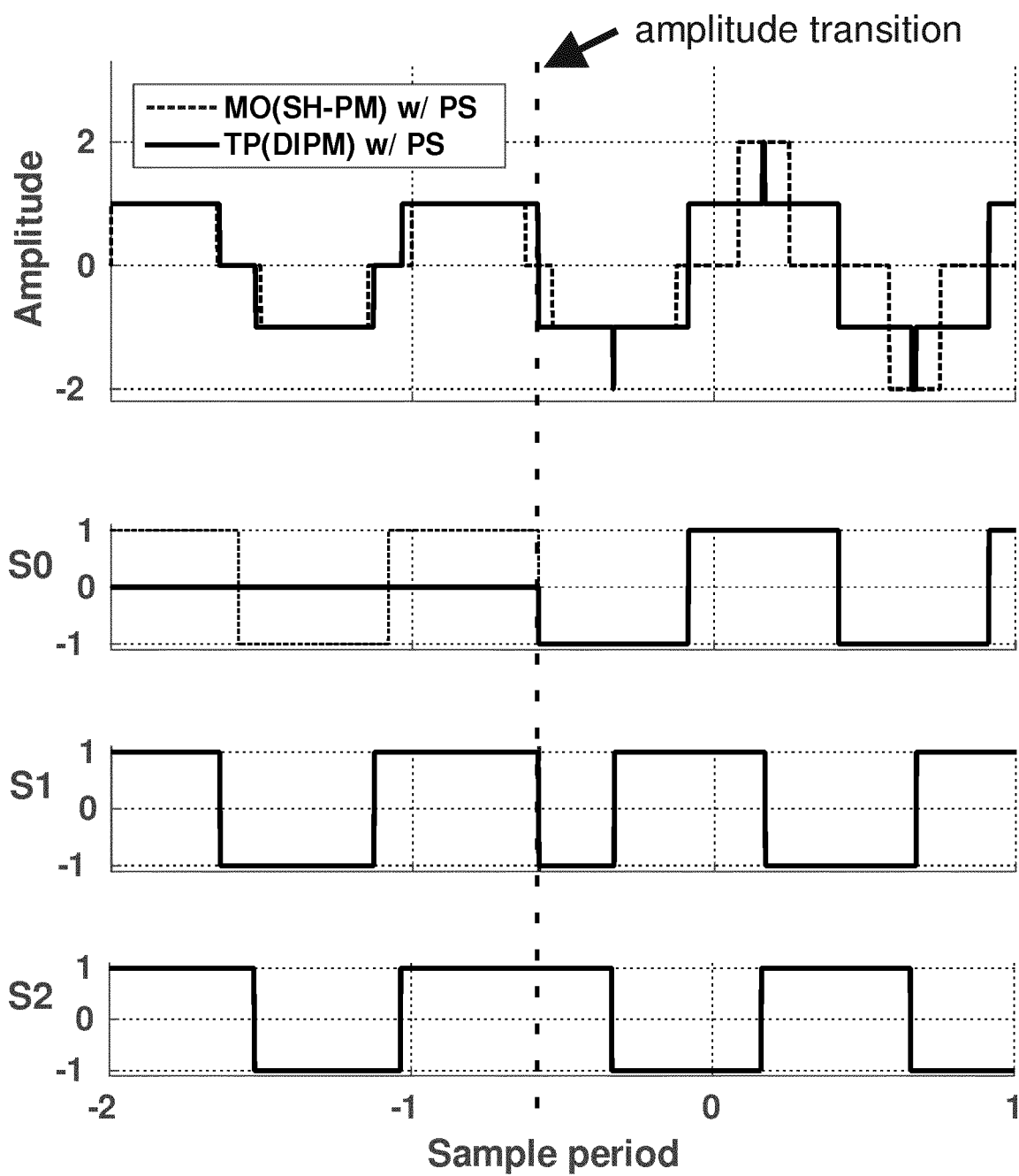
FIG. 4 illustrates a time-domain comparison of the multilevel outphasing approach and the tri-phasing approach near an amplitude level transition.

The time-domain behavior of an output square wave signal of the tri-phasing approach with DIPM near an amplitude level transition is illustrated in FIG. 4 along with the corresponding output square wave of the multi-level outphasing approach with SH-PM. The signals $S_0(t)$, $S_1(t)$ and $S_2(t)$ are also shown independently, demonstrating that right before the amplitude level transition at the dotted line, the outphasing modulators are in phase, and after the transition they are out of phase. All the illustrated signals are normalized signals.

Figure 5:
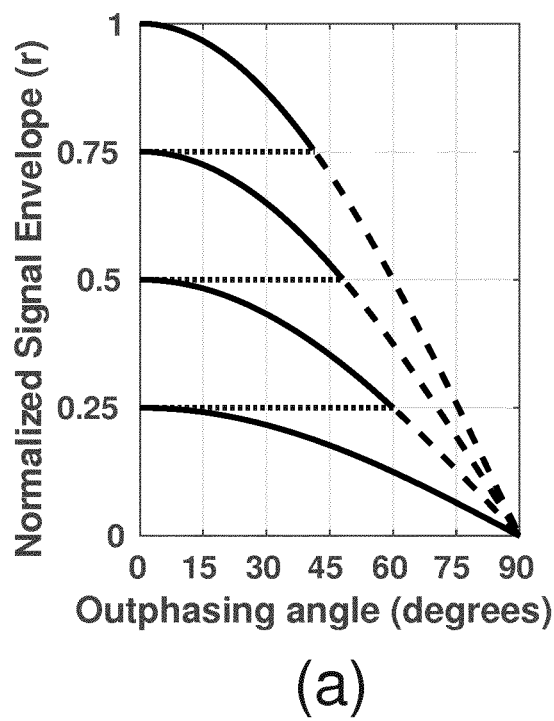
FIG. 5 illustrates signal envelope amplitude as a function of the outphasing angle for multilevel outphasing and tri-phasing approaches.
Figure 5:
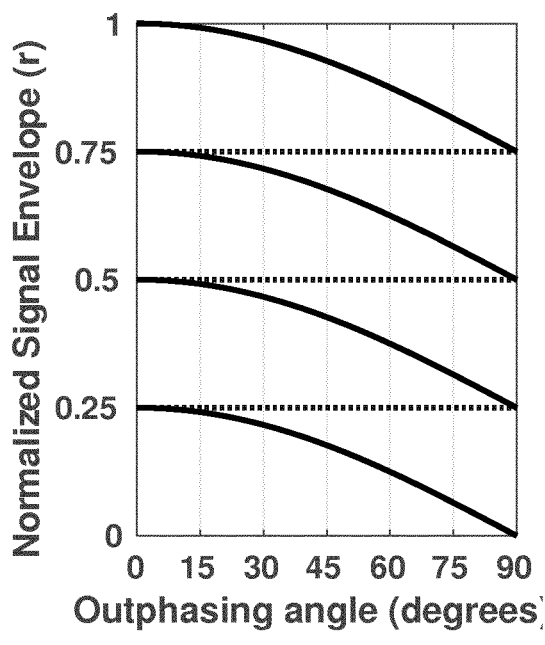

FIG. 5 illustrates another beneficial property of the tri-phasing approach compared to the multi-level outphasing, namely the lack of redundancy in the outphasing angle range. In multilevel outphasing, some of the outphasing angle range is redundant, except at the lowest amplitude level, as illustrated in FIG. 5(a). In contrast, this redundancy does not exist in tri-phasing approach as the entire outphasing angle range is used at all levels as may be observed in FIG. 5(b). This lack of redundancy effectively increases the output amplitude resolution.

Figure 6:
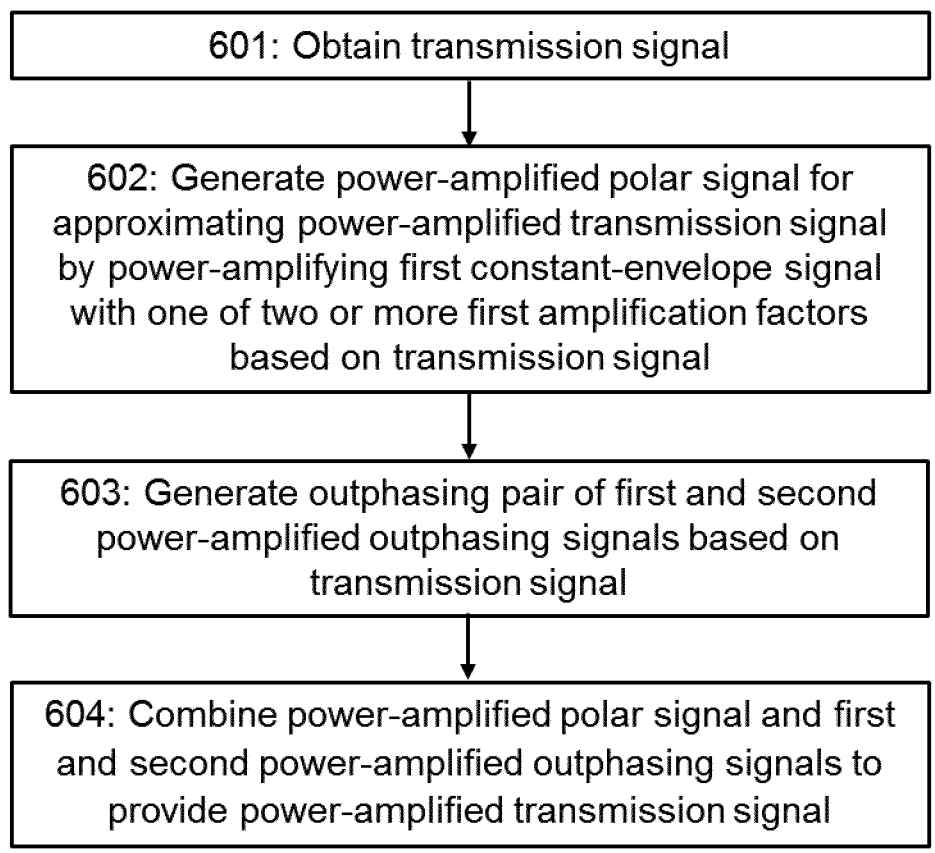
FIG. 6 illustrates a flow diagram of a method according to an embodiment of the invention.

A method according to an embodiment of the invention for realizing power-amplification of a transmission signal according to the tri-phasing principle is illustrated in FIG. 6. The method may be performed by a transmitter. For example, the method may be performed by the transmitter illustrated in FIG. 8 and to be described in detail later.

Referring to FIG. 6, a transmitter obtains, in block 601, a transmission signal with phase and amplitude modulation.

Based on the transmission signal, the transmitter generates, in block 602, a power-amplified polar signal for approximating a power-amplified transmission signal by power-amplifying a first constant-envelope signal with one of two or more first amplification factors. Also based on the transmission signal, the transmitter generates, in block 603, an outphasing pair of a first power-amplified outphasing signal and a second power-amplified outphasing signal. Finally, the transmitter combines, in block 604, the power-amplified polar signal, the first power-amplified outphasing signal and the second power-amplified outphasing signal to provide the power-amplified transmission signal.

Figure 7:
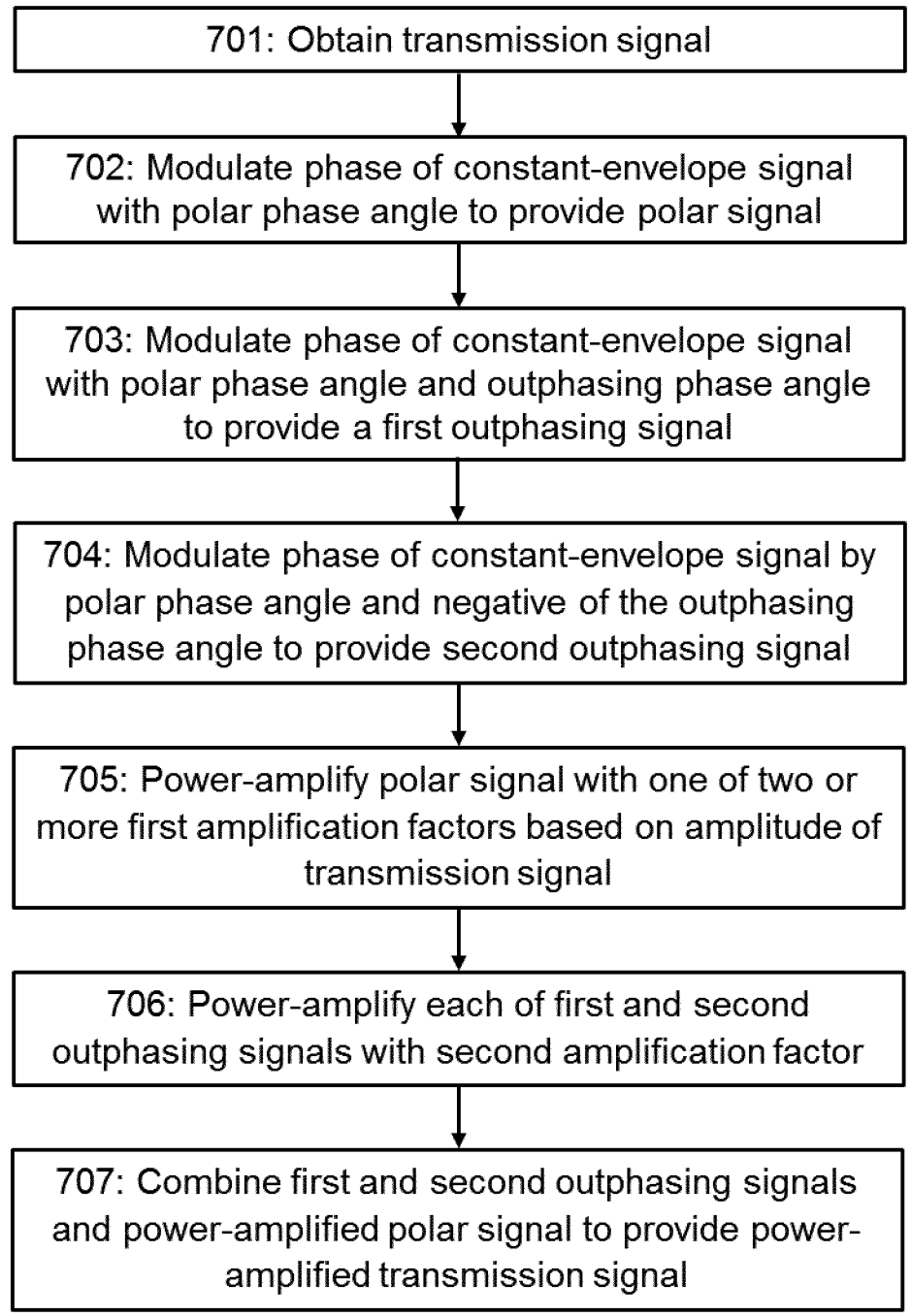
FIG. 7 illustrates a flow diagram of a method according to an embodiment of the invention.

Another method according to another embodiment of the invention for realizing power-amplification of a transmission signal is illustrated in FIG. 7. This method may also be performed by a transmitter and specifically by the transmitter illustrated in FIG. 8.

Referring to FIG. 7, a transmitter obtains, in block 701, a transmission signal with phase and amplitude modulation to be power-amplified prior to transmission. The transmission signal may comprise in-phase and quadrature component and may be in a digital form. The transmission signal may also have relatively high peak-to-average power ratio, necessitating the use of switched mode power amplifiers for high efficiency. The transmitter modulates, in block 702, a phase of a first constant-envelope signal with a polar angle to provide a polar signal. The polar signal may correspond to the polar modulator $S_0(t)$. Then, the transmitter modulates, in block 703, the phase of a second constant-envelope signal with the polar angle and an outphasing angle to provide a first outphasing signal and, in block 704, the phase of a third constant-envelope signal with the polar angle and a negative of the outphasing angle to provide a second outphasing signal. The first and second outphasing signals may correspond to $S_1(t)$ and $S_2(t)$, respectively. The first, second and third constant envelope signals may be substantially equal in terms of amplitude and phase. The transmitter power-amplifies, in block 705, the polar signal with one of two or more first amplification factors, said one of two or more first amplification factors being selected based on an amplitude of the transmission signal for approximating a power-amplified transmission signal with the power-amplified polar signal. The two or more first amplification factors may correspond to two or more pre-defined amplitude levels of the transmission signal which correspond to two or more pre-defined amplitude levels of the power-amplified transmission signal and said one of the two or more first amplification factors may be selected such that a corresponding pre-defined amplitude level of the transmission signal approximates the amplitude of the transmission signal. The approximating may be based on applying a ceiling function to the transmission signal. Each first amplification factor may be realized with a different first switched-mode power amplifier with differing gain and possibly having other differing properties. Alternatively, each first amplification factor may be realized with a combination of one or more first switched-mode power amplifiers having fully or partly equal or differing gains. In an embodiment, the two or more first amplification factors are realized by choosing different numbers of switched-mode power amplifiers having equal gain to be active simultaneously. The transmitter power-amplifies, in block 706, each of the first outphasing signal and the second outphasing signal with a second amplification factor. The second amplification factor may be defined such that an amplitude of the combined power-amplified outphasing signal is always equal to or smaller than a separation between any two adjacent pre-defined amplitude levels of the power-amplified transmission signal. The second amplification factor may be realized with a second switched-mode power amplifier and a third switched mode power amplifier for amplifying the first outphasing signal and the second outphasing signal. The second and the third switched mode power amplifiers may be the same type of power amplifiers or they may be different types of power amplifiers with substantially equal gain. The transmitter combines, in block 707, the power-amplified first outphasing signal, the power-amplified second outphasing signal and the power-amplified polar signal to provide a power-amplified transmission signal for one or more antennas, wherein an amplitude of the power-amplified transmission signal is modulated by the outphasing angle. The order in which the power-amplified first and second outphasing signals and the power-amplified polar signal are combined may be arbitrary.

In an embodiment, the outphasing angle is selected such that an amplitude of a combination of the first outphasing signal and the second outphasing signal is equal to a difference between the amplitude of the transmission signal and a pre-defined amplitude level of the transmission signal approximating the amplitude of the transmission signal and corresponding to said one of two or more first amplification factors. Such a selection enables fine amplitude resolution between pre-defined amplitude levels in the power-amplified transmission signal.

In another embodiment, the first amplification factors and the second amplification factor have been chosen such that the power-amplified transmission signal when normalized corresponds to the normalized phase- and magnitude-modulated transmission signal V(t) according to the definition of the tri-phasing signal composition, namely as:

$$V(t) = \frac{1}{2A_{max}}(2\,A_{TP}(t)S_0(t) + S_1(t) + S_2(t)),$$

$$S_0(t) = \cos(\omega_c t + \phi(t)),$$

$$S_1(t) = \cos(\omega_c t + \phi(t) + \theta(t)),$$

$$S_2(t) = \cos(\omega_c t + \phi(t) - \theta(t)),$$

$$A_{TP}(t) = A_{MO}(t) - 1,$$

$$\theta_{TP}(t) = \arccos(r(t)A_{max} - A_{TP}(t)).$$

In some embodiments, the signals $S_0(t)$, $S_1(t)$ and $S_2(t)$ may be, instead of sinusoidal signals as depicted above, any signals formed by a summation of sinusoidal signals, square wave signals, triangle signals, sawtooth signals or other non-sinusoidal periodic signals.

Figure 8:
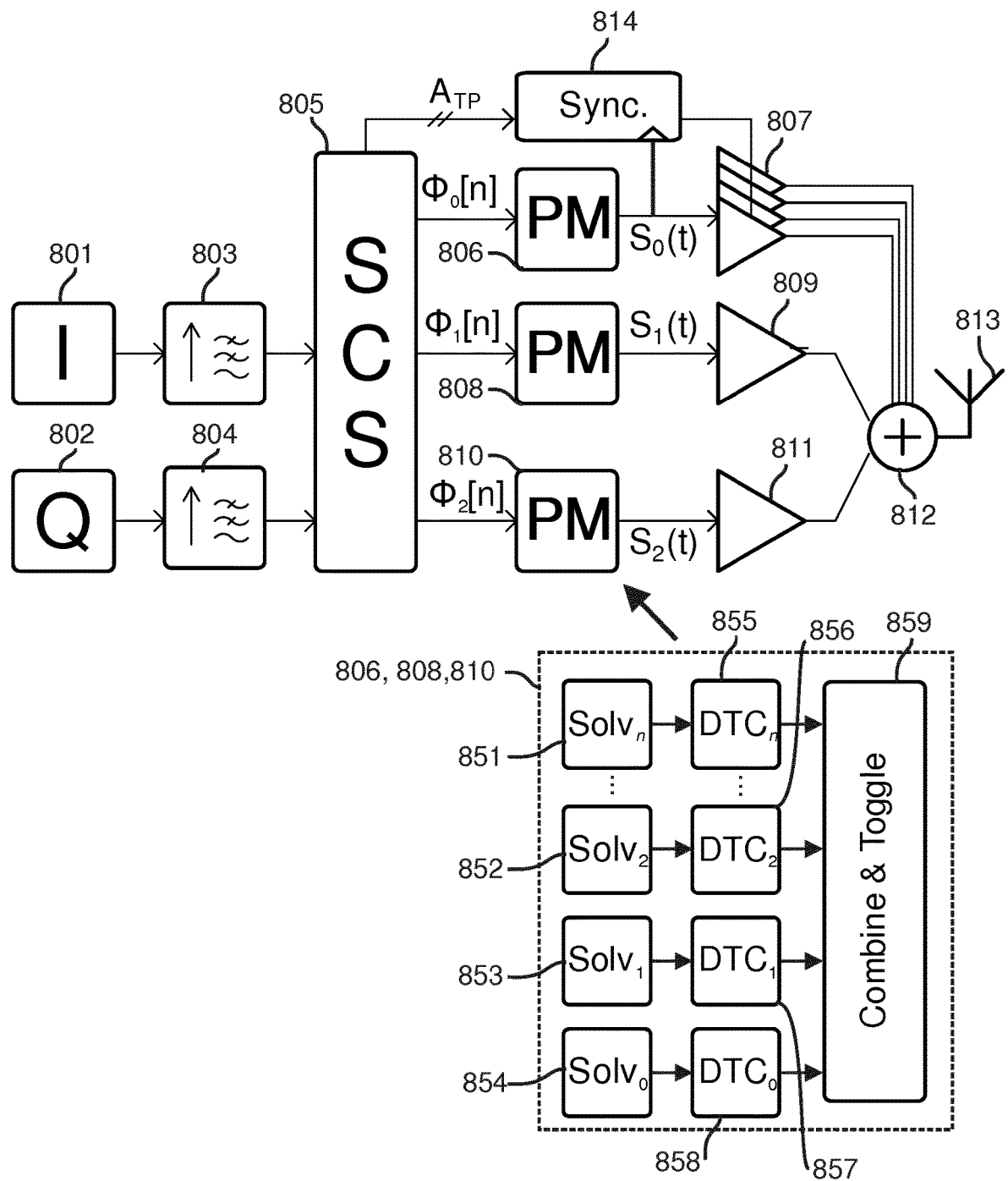
FIG. 8 illustrates a block diagram of a tri-phasing transmitter according to an embodiment of the invention.

FIG. 8 illustrates a tri-phasing architecture for realizing the tri-phasing signal composition described above and performing the method illustrated in FIGS. 6 and/or 7.

Referring to FIG. 8, the I and Q modulation sources 801, 802, the upsampling and low-pass filtering units 803, 804 and the antenna(s) 813 may be similar, respectively, to the elements 101, 102, 103, 104, 111 as described in relation to FIG. 1. Similar to FIGS. 1 and 2, the I and Q components of the transmission signal may be fed to the upsampling and low-pass filtering units 803, 804 and from the upsampling and low-pass filtering units 803, 804 to the signal component separator unit 805.

In order carry out signal processing according to the tri-phasing approach, the signal component separator 805 needs to be modified compared to the prior art solutions of FIGS. 1 and 2. The signal component separator 805 may provide each phase modulator 806, 808, 810 the phase signal ρ[n] which consists of α for defining the carrier frequency, the polar angle φ[n] and the outphasing angle θ[n]. The carrier frequency may be a radio frequency. In some embodiments, the outphasing angle may only be provided for the phase modulators 808, 810 responsible for the outphasing. The signal component separator may also provide the amplitude level $A_{TP}[n]$ for the two or more power amplifiers 807 used for selecting a pre-defined amplitude level and to the synchronization means 814 which may be, for example, a first-in-first-out buffer. The signal component separator 805 may provide the information on an upcoming amplitude transition one sample period earlier than in multilevel outphasing in order to enable continuous amplitude level transitions.

The elements 806, 807, 814 are used for creating the power-amplified polar signal which may provide a rough approximation of the power-amplified transmission signal having an amplitude corresponding to one of two or more pre-defined amplitude levels. To provide a simplified description of the operation of said elements, the phase modulator 806 may generate the polar modulator signal $S_0(t)$ with phase shift φ(t) which may be amplified with one of the two or more power amplifiers 807 (which are preferably switched-mode power amplifiers) and fed to the combiner 812. The selection on which power amplifier to use for amplification may be based on the discrete amplitude level $A_{TP}$ provided by the signal component separator 805.

The elements 808, 809, 810, 811 are used for realizing the outphasing, that is, for generating a pair of outphasing signals responsible for fine tuning the amplitude of the power-amplified transmission signal. Similar to the outphasing transmitter of FIG. 1, the phase modulators 808, 810 may generate two outphasing signals $S_1(t)$ and $S_2(t)$ with phase shifts φ(t)+θ(t) and φ(t)−θ(t) and the power amplifiers 809, 811 (preferably switched-mode power amplifiers) may amplify said two outphasing with equal or at least substantially equal gain. Thereafter, the power-amplified are fed to the combiner 812 where the outphasing signals are combined with each other and with the power-amplified polar signal to provide the power-amplified transmissions signal. In some embodiments, two combiners may be arranged so that the outphasing signals are combined with a first combiner and the combined outphasing signal is combined with the polar signal with a second combiner. Modulating the outphasing angle may enable the tuning of the amplitude of the transmission signal between the pre-defined amplitude levels defined via the two or more power amplifiers 807.

In order to achieve continuous amplitude level transitions as illustrated in FIG. 4, special configuration is needed not only for the signal component separator 805 but also for the phase modulators 806, 808, 810. In an embodiment of the invention enabling continuous amplitude level transitions, the phase modulators 806, 808, 810 are digital interpolating phase modulators (DIPM) or some of the phase modulators 806, 808, 810 are digital interpolating phase modulators. The DIPMs may be configured to perform a single linear interpolation between two samples of the phase. A simplified, exemplary block diagram of the DIPM is shown in the inset of FIG. 8 where the solvers $Solv_0$ 854, $Solv_1$ 853, $Solv_2$ 852 and $Solv_n$ 851 control individual digital-to-time converters (DTC) 858, 857, 856, 855 which generate accurately delayed pulses that are combined and used to toggle a T-flip-flop with element 859 in order to reconstruct the phase modulated signal.

Figure 9:
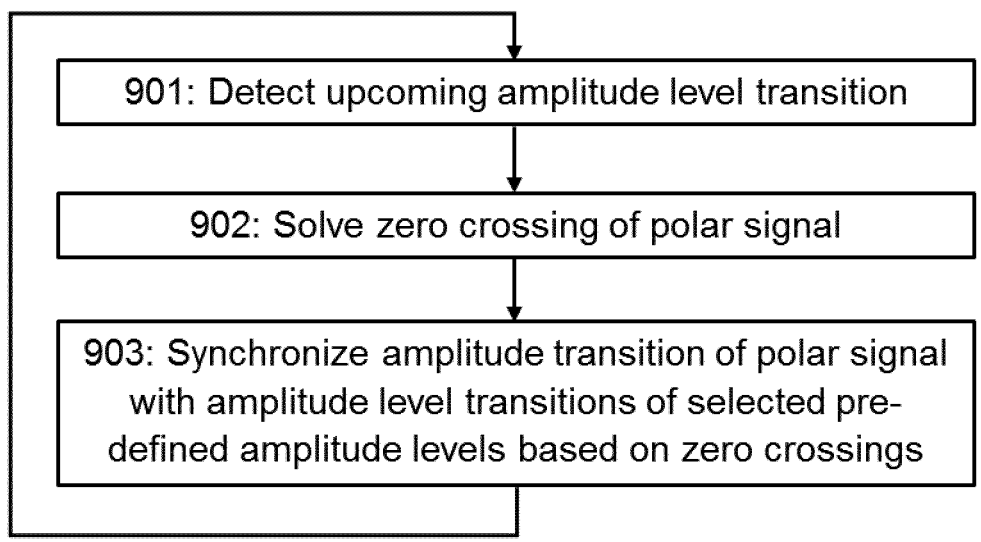
FIG. 9 illustrates a flow diagram of a method according to an embodiment of the invention.

While the simplified, generic block diagram for the DIPM shown in the inset of FIG. 8 applies also for tri-phasing transmitter of FIG. 8, the DIPM solver DSP (digital signal processor) may need to be configured specifically for the needs of the illustrated tri-phasing transmitter architecture. Specifically, the DIPM solver DSP may be configured to perform the method illustrated in FIG. 9. When an upcoming amplitude level transition defined by a change in $A_{TP}[n]$ is detected in block 901, the DIPM 806 may be configured to first solve, in block 902, the optimum polar modulator (polar signal) zero crossing. The synchronization between the polar modulator transition to the amplitude data of $A_{TP}[n]$ may, then, be acquired, in block 903, from the solved polar modulator zero crossings by, for example, utilizing a first-in-first-out (FIFO) buffer 814 sensitive to rising and falling transitions. A FIFO buffer is a data buffer where the oldest entry is processed first. The DIPM 806 may be configured to provide the information on zero crossings of the polar modulator to the FIFO buffer 814 and/or to the signal component separator 805. The signal component separator 805 may be configured to drive at least the $A_{TP}[n]$ data to the FIFO buffer 814 with the number of transitions and amplitude values at each sample period, and fetched at polar modulator transitions. The zero crossing may also serve as a reference for the outphasing modulators 808, 810 to perform the instantaneous π/2 phase jump. It should be appreciated that the embodiments of the invention are not limited to the use of FIFO buffer as synchronization means 814. Any means for achieving synchronization between the polar modulator transitions and the amplitude data may be used.

As mentioned earlier, the DIPM 806 responsible for the polar modulator may be configured to calculate zero crossings of the polar modulator. The DIPM 806 may estimate the zero crossings with a single interpolation per sample. If several crossings exist, the crossing located nearest to the middle of the sample period is chosen to be used as a reference phase from the amplitude level transition. When the zero crossing is close to the middle of the period, the envelope interpolation may be balanced between the two interpolation stages as will be described in the following paragraph. The lower the generated carrier frequency is in the DIPM 806, the more infrequent the zero crossings become. Thus, there may be situations where the discrete amplitude level should change, but the polar modulator does not have any zero crossings during that period. To deal with such events, the DIPM 806 and/or signal component separator 805 may be configured to delay the amplitude level transition to the following period and keep waiting for the next zero crossing to appear next period. In addition to delaying the amplitude level transition, the outphasing angle may be set to the boundary value, thus waiting with either minimum or maximum amplitude for the amplitude level transition.

Figure 10:
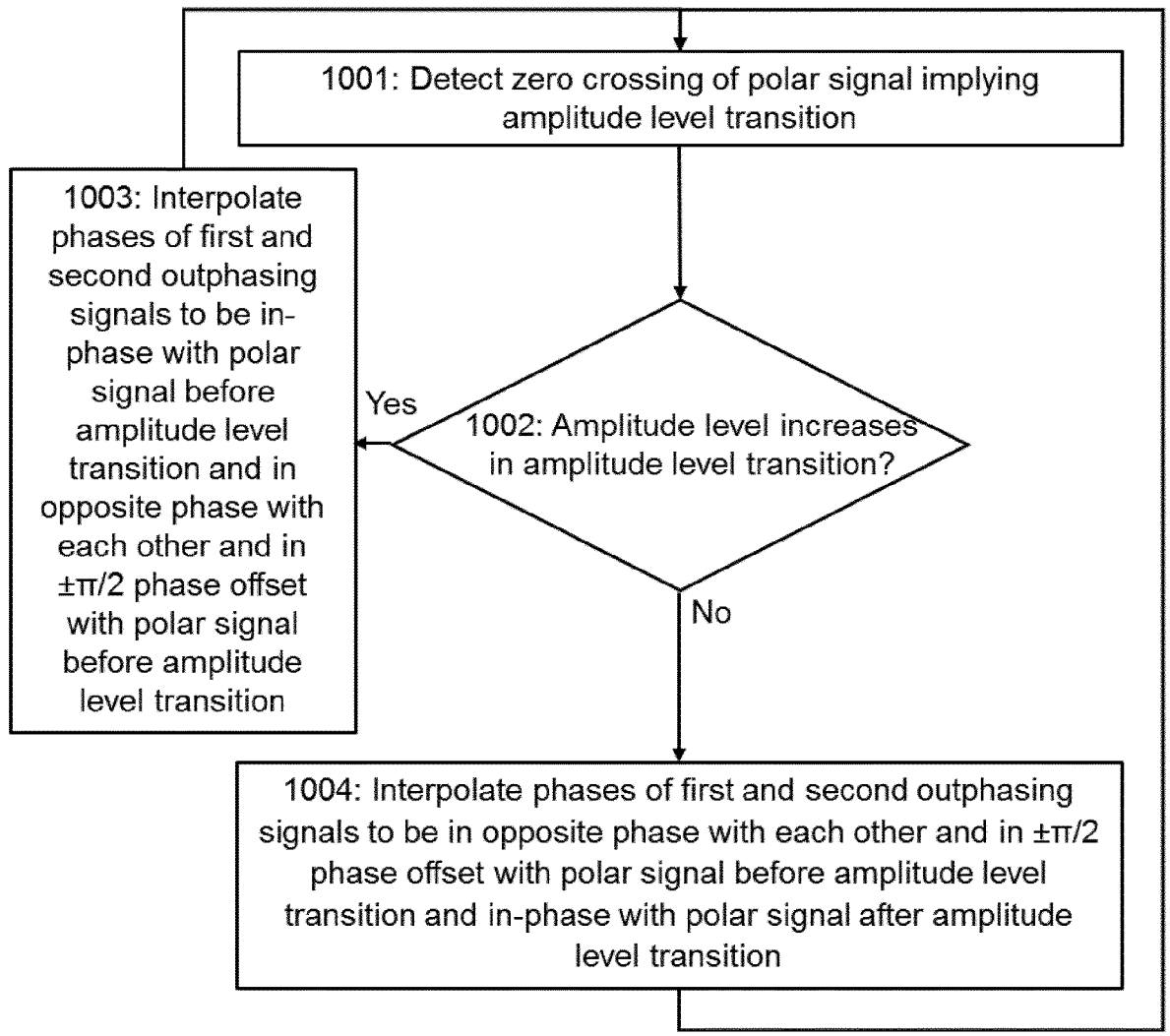
FIG. 10 illustrates a flow diagram of a method according to an embodiment of the invention.

In addition to the aforementioned DIPM configuration to account for the zero crossing calculations, the DIPMs 808, 810 may also be configured to perform interpolation in a different way near amplitude level transitions to account for the π/2 jump in the outphasing angle as illustrated in FIG. 10. Specifically, when a zero crossing is detected, in block 1001, the outphasing DIPM 808, 810 may perform the interpolation in two stages in two different ways. The phase values of the two outphasing signals before and after the phase jump are dependent on the direction of the amplitude level transition and are either equal to the polar modulator (i.e., the polar signal) or with a ±π/2 phase offset (that is, one outphasing signal has a +π/2 phase offset and the other one has a −π/2 phase offset compared to the polar modulator). If an increasing amplitude level is detected in block 1002, phases of the outphasing signals may be interpolated, in block 1003, to be in-phase with the polar modulator right before the transition, thus providing maximum amplitude, and shifted out-of-phase (in opposite phase) with each other and in a ±π/2 phase offset with the polar modulator after the transition, providing zero amplitude. Conversely, when the amplitude level is detected to decrease in block 1002, the outphasing signals may be interpolated, in block 1004, to be shifted out-of-phase with each other and in a ±π/2 phase offset with the polar modulator right before the transition, and in-phase with the polar modulator after the transition. Due to hardware limitations, each of the n DTCs 855, 856, 857, 858 within the DIPM 806, 808, 810 as illustrated in the inset of FIG. 8 may only process a single sign toggling event per sample period. This limitation may occasionally lead to situations where an event would be discarded and the phase of the modulator may become shifted by an offset equal to Tr. Therefore, the DIPM solver DSP should be implemented in a way that these events are detected and handled appropriately. For example, the second event (that is, the event to be discarded) may be transferred to the first value of the following DTC.

The tri-phasing approach illustrated in FIGS. 3, 6 and 7 and the tri-phasing transmitter illustrated in FIG. 8 offer multiple significant benefits compared to prior art and specifically the multilevel outphasing approach. Specifically, the tri-phasing transmitter architecture may enable:
wide signal bandwidth (>100 MHz aggregated LTE)
high linearity: ACLR (<−50 dBc)
digitally controllable carrier frequency without additional LO circuitry up to digital signal sample-rate (or even higher if some linearity degradation may be tolerated) and
high efficiency due to the use switched-mode PAs and multilevel operation.

The tri-phasing approach may provide the efficiency of multilevel outphasing, while enabling linearity of outphasing. Thus, tri-phasing is extremely scalable.

Figure 11:
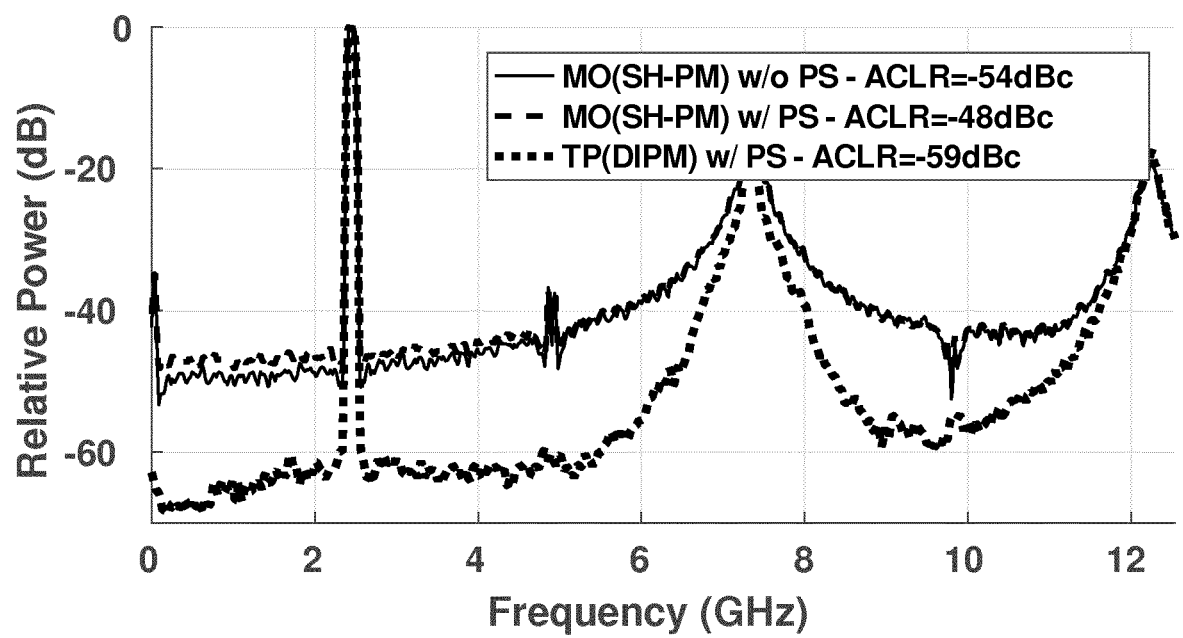
FIG. 11 illustrates an example of linearity performance comparison between multilevel outphasing and tri-phasing transmitters.

One example of the improvement in linearity of a transmitter provided by the tri-phasing approach is illustrated in FIG. 11. FIG. 11 shows the spectra of a 100 MHz signal at 2.46 GHz center frequency using multilevel outphasing approach with sample-and-hold phase modulators with/without pulse swallowing and using tri-phasing approach with DIPMs. Clearly, linearity is considerably improved with the tri-phasing approach. The ACLR is also significantly improved by using the tri-phasing approach, especially compared to the case where pulse swallowing is taken into account.

According to an embodiment of the invention, the tri-phasing transmitter may be used in low radio frequency base station, potentially requiring good ACLR, wide signal bandwidths and benefits from good overall transmitter efficiency. In some embodiments, the tri-phasing transmitter may be utilized as an IF-transmitter for millimeter-wave applications. Tri-phasing according the embodiments of the invention is also extremely scalable due to the fact that it is very digital-intensive and may utilize switched-mode PAs, therefore low power versions (of DSP and modulators) may be used to power user equipment, while more linear variants may be utilized in base stations.

The embodiments of the invention may be realized in a radio transmitter comprising a processing unit configured to carry out baseband signal processing operations on signals to be transmitted from the radio transmitter. The processing unit may be implemented by an application-specific integrated circuit (ASIC) or by a digital signal processor configured by suitable software. The processing unit may be configured to perform at least some of the steps shown in the flowchart of FIG. 6 and/or FIG. 7 and/or FIG. 9 and/or FIG. 10 or described in connection with FIG. 8. Some or all of the steps shown in the flowchart of FIG. 6 and/or FIG. 7 and/or FIG. 9 and/or FIG. 10 or described in connection with FIG. 8 may be performed by dedicated hardware components. The embodiments may be implemented as a computer program comprising instructions for executing a computer process for power-amplifying a transmission signal.

The computer program may be stored on a computer program distribution medium readable by a computer or a processor. The computer program medium may be for example, but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but it can be modified in several ways within the scope of the appended claims. Therefore, all words and expressions should be interpreted broadly and they are intended to illustrate, not to restrict, the embodiment. It will be obvious to a person skilled in the art that, as technology advances, the inventive concept can be implemented in various ways. Further, it is clear to a person skilled in the art that the described embodiments may, but are not required to, be combined with other embodiments in various ways.

The invention claimed is:

1. A method, comprising:
obtaining a transmission signal with phase and amplitude modulation;
generating a power-amplified polar signal for approximating a power-amplified transmission signal by power-amplifying a first constant-envelope signal with one of two or more first amplification factors based on the transmission signal;
generating an outphasing pair of a first power-amplified outphasing signal and a second power-amplified outphasing signal based on the transmission signal; and
combining the power-amplified polar signal, the first power-amplified outphasing signal and the second power-amplified outphasing signal to provide the power-amplified transmission signal, wherein each outphasing signal of the outphasing pair is generated by an outphasing transmitter configured to generate amplitude modulation by utilizing a phase offset between two constant-envelope signals.

2. The method of claim 1, wherein the generating the outphasing pair comprises:
modulating a phase of a second constant-envelope signal with an outphasing angle to provide a first outphasing signal;
modulating a phase of a third constant-envelope signal with a negative of the outphasing angle to provide a second outphasing signal; and
power-amplifying each of the first outphasing signal and the second outphasing signal with a second amplification factor to provide the outphasing pair.

3. The method of claim 2, wherein the generating the power-amplified polar signal comprises:
before applying said one of two or more first amplification factors, modulating a phase of the first constant-envelope signal with a polar angle to provide a polar signal, and
the generating the outphasing pair further comprises:
modulating the phase of the second constant-envelope signal also with the polar angle; and
modulating the phase of the third constant-envelope signal also with the polar angle.

4. The method according to claim 1, wherein the two or more first amplification factors correspond to two or more pre-defined amplitude levels of the transmission signal which correspond to two or more pre-defined amplitude levels of the power-amplified transmission signal, and wherein said one of the two or more first amplification factors is selected such that a corresponding pre-defined amplitude level of the transmission signal approximates the amplitude of the transmission signal.

5. The method of claim 4, wherein the second amplification factor is defined such that an amplitude of a combined power-amplified outphasing signal is always equal to or smaller than a separation between any two adjacent pre-defined amplitude levels of the power-amplified transmission signal, and wherein the combined power-amplified outphasing signal is a combination of the first power-amplified outphasing signal and the second power-amplified outphasing signal.

6. The method of claim 5, wherein the outphasing angle is selected such that an amplitude of a combination of the first outphasing signal and the second outphasing signal is equal to a difference between the amplitude of the transmission signal and a selected pre-defined amplitude level of the transmission signal corresponding to said one of two or more first amplification factors to enable fine amplitude resolution between pre-defined amplitude levels.

7. The method according to claim 1, wherein the power-amplified transmission signal when normalized is defined by equation:

$$V(t) = \frac{1}{2} A_{max}(2A_{TP}(t)S_0(t) + S_1(t) + S_2(t)),$$

wherein $A_{max}$ is the number of the pre-defined amplitude levels of the transmission signal, $A_{TP}(t)$ is a non-negative integer representing a selected pre-defined amplitude level having a value from zero to $A_{max}-1$, $S_0(t)$ is a first periodic signal with phase $\omega_c t + \phi(t)$ corresponding to the polar signal, $S_1(t)$ is a second periodic signal with phase $\omega_c t + \phi(t) + \theta(t)$ corresponding to the first outphasing signal, $S_2(t)$ is a third periodic signal with phase $\omega_c t + \phi(t) - \theta(t)$ corresponding to the second outphasing signal, $\omega_c$ is a carrier frequency, $\phi(t)$ is the polar angle and $\theta(t)$ is the outphasing angle.

8. The method of claim 7, wherein the first periodic signal, the second periodic signal and the third periodic signal are sinusoidal signals, square wave signals or any signals formed by a summation of sinusoidal signals.

9. The method of claim 7, wherein the non-negative integer representing the selected pre-defined amplitude level and the outphasing angle are defined according to equations:

$$A_{TP}(t) = \text{ceiling}(r(t)A_{max}) - 1,$$

$$\theta(t) = \arccos(r(t)A_{max} - A_{TP}(t)),$$

wherein "ceiling" denotes a ceiling function and $r(t)$ is a normalized envelope amplitude of the transmission signal.

10. The method according to claim 3, wherein the modulating the phase of the first constant-envelope signal, the second constant-envelope signal and the third constant-envelope signal are performed, respectively, by a first digital linearly interpolating phase modulator, a second digital linearly interpolating phase modulator and a third digital linearly interpolating phase modulator.

11. The method according to claim 3, further comprising:
detecting an upcoming amplitude level transition of selected pre-defined amplitude levels;
solving a zero crossing of the polar signal; and
synchronizing an amplitude transition of the polar signal with the upcoming amplitude level transition based on the zero crossing of the polar signal.

12. The method of claim 11, wherein the detecting the zero crossings of the polar signal is performed by the first digital interpolating phase modulator and the synchronizing the amplitude transitions is performed by synchronization means.

13. The method of claim 11, further comprising:
in response to detecting a zero crossing of the polar signal implying an amplitude level transition of selected pre-defined amplitude levels, performing interpolation in the digital interpolating phase modulators in two stages to account for a $\pi/2$ phase jump resulting from the amplitude level transition, wherein the two stages comprise:
if an amplitude level is detected to increase in the amplitude level transition, interpolating phases of the first outphasing signal and the second outphasing signal to be in-phase with the polar signal right before the amplitude level transition and in opposite phase with each other and in a $\pm\pi/2$ phase offset with the polar signal right after the amplitude level transition; and
if the amplitude level is detected to decrease in the amplitude level transition, interpolating phases of the first outphasing signal and the second outphasing signal to be in opposite phase with each other and in a $\pm\pi/2$ phase offset with the polar signal right before the amplitude level transition and in-phase with the polar signal right after the amplitude level transition.

14. The method of claim 1, wherein the power-amplifying the first constant-envelope signal, the second constant-envelope signal and the third constant-envelope signal are performed, respectively, by one or more first switched-mode power amplifiers selected from two or more switched-mode power amplifiers, a second switched-mode power amplifier and a third switched-mode power amplifier.

15. The method of claim 1, wherein the transmission signal comprises in-phase and quadrature components.

16. An apparatus, comprising:
a signal component separator unit configured to receive a transmission signal with phase and amplitude modulation and to output a polar angle, an outphasing angle, and discrete amplitude level information based on the received transmission signal;
a first phase modulator configured to modulate a phase of a first constant-envelope signal with the polar angle to provide a polar signal;
a second phase modulator configured to modulate a phase of a second constant-envelope signal with the polar angle and the outphasing angle to provide a first outphasing signal;
a third phase modulator configured to modulate a phase of a third constant-envelope signal with the polar angle and a negative of the outphasing angle to provide a second outphasing signal;

two or more first power amplifiers configured to power-amplify the polar signal with one of two or more first amplification factors according to the discrete amplitude level information to provide a power-amplified polar signal, wherein said one of two or more first amplification factors are realized by selecting one or more of the two or more first power amplifiers to be active;

a second power amplifier configured to power-amplify the first outphasing signal with a second amplification factor to provide a first power-amplified outphasing signal;

a third power amplifier configured to power-amplify the second outphasing signal with the second amplification factor to provide a second power-amplified outphasing signal; and one or more combiners configured to combine the power-amplified polar signal, the first power-amplified outphasing signal and the second power-amplified outphasing signal to provide a power-amplified transmission signal, wherein the first power-amplified outphasing signal and the second power-amplified outphasing signal are generated by at least one outphasing transmitter configured to generate amplitude modulation by utilizing a phase offset between two constant-envelope signals.

17. The apparatus of claim 16, wherein the first phase modulator is a digital interpolating phase modulator and is further configured to detect upcoming amplitude level transitions of selected pre-defined amplitude level and solve zero crossings of the polar signal, the apparatus further comprising:

a synchronizer configured to synchronize amplitude transitions of the polar signal with amplitude level transitions defined by the selecting said one or more first power amplifiers to be active based on zero crossings of the polar signal.

18. The apparatus of claim 16, wherein the second phase modulator and the third phase modulator are digital interpolating phase modulators and are further configured, in response to the first phase modulator detecting a zero crossing of the polar signal implying an amplitude level transition of selected pre-defined amplitude levels, to perform interpolation in two stages to account for a π/2 phase jump resulting from the amplitude level transition, wherein the two stages comprise:

in response to an amplitude level being detected by the first phase modulator to increase in the amplitude level transition, the second phase modulator and the third phase modulator are configured to interpolate phases of the first outphasing signal and the second outphasing signal to be in-phase with the polar signal right before the amplitude level transition and in opposite phase with each other and in a ±π/2 phase offset with the polar signal right after the amplitude level transition; and in response to the amplitude level being detected by the first phase modulator to decrease in the amplitude level transition, the second phase modulator and the third phase modulator are configured to interpolate phases of the first outphasing signal and the second outphasing signal to be in opposite phase with each other and in a ±π/2 phase offset with the polar signal right before the amplitude level transition and in-phase with the polar signal right after the amplitude level transition.

19. A computer program product embodied on a non-transitory computer-readable medium, and comprising program instructions which, when loaded into an apparatus, cause the apparatus to execute the method according to claim 1.

20. An apparatus, comprising:

a signal component separator unit configured to receive a transmission signal with phase and amplitude modulation;

a polar section configured to generate a power-amplified polar signal for approximating a power-amplified transmission signal by power-amplifying a first constant-envelope signal with one of two or more first amplification factors based on the transmission signal;

an outphasing section configured to generate an outphasing pair of a first power-amplified outphasing signal and a second power-amplified outphasing signal based on the transmission signal, wherein the first power-amplified outphasing signal and the second power-amplified outphasing signal are generated by at least one outphasing transmitter configured to generate amplitude modulation by utilizing a phase offset between two constant-envelope signals; and a combiner configured to combine the power-amplified polar signal, the first power-amplified outphasing signal and the second power-amplified outphasing signal to provide the power-amplified transmission signal.

21. An apparatus, comprising:

at least one processor; and at least one memory including computer program code;

the at least one memory and the computer program code configured to, with the at least one processor, cause the apparatus at least to:

receive a transmission signal with phase and amplitude modulation and to output a polar angle, an outphasing angle, and discrete amplitude level information based on the received transmission signal;

modulate a phase of a first constant-envelope signal with the polar angle to provide a polar signal;

modulate a phase of a second constant-envelope signal with the polar angle and the outphasing angle to provide a first outphasing signal;

modulate a phase of a third constant-envelope signal with the polar angle and a negative of the outphasing angle to provide a second outphasing signal;

power-amplify the polar signal with one of two or more first amplification factors according to the discrete amplitude level information to provide a power-amplified polar signal, wherein said one of two or more first amplification factors are realized by selecting one or more of the two or more first power amplifiers to be active;

power-amplify the first outphasing signal with a second amplification factor to provide a first power-amplified outphasing signal;

power-amplify the second outphasing signal with the second amplification factor to provide a second power-amplified outphasing signal; and combine the power-amplified polar signal, the first power-amplified outphasing signal and the second power-amplified outphasing signal to provide a power-amplified transmission signal, wherein the first power-amplified outphasing signal and the second power-amplified outphasing signal are generated by at least one outphasing transmitter configured to generate amplitude modulation by utilizing a phase offset between two constant-envelope signals.

* * * * *